United States Patent
Sasaki

(10) Patent No.: US 10,490,734 B2
(45) Date of Patent: Nov. 26, 2019

(54) MAGNETORESISTANCE EFFECT DEVICE

(71) Applicant: TDK CORPORATION, Tokyo (JP)

(72) Inventor: Tomoyuki Sasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 7 days.

(21) Appl. No.: 15/715,836

(22) Filed: Sep. 26, 2017

(65) Prior Publication Data

US 2018/0090672 A1 Mar. 29, 2018

(30) Foreign Application Priority Data

Sep. 29, 2016 (JP) ................. 2016-192011

(51) Int. Cl.
| | | |
|---|---|---|
| *H01L 43/08* | (2006.01) | |
| *H01L 43/10* | (2006.01) | |
| *H01L 43/02* | (2006.01) | |
| *H01L 43/12* | (2006.01) | |
| *H01L 27/22* | (2006.01) | |

(52) U.S. Cl.
CPC ............ *H01L 43/08* (2013.01); *H01L 27/228* (2013.01); *H01L 43/02* (2013.01); *H01L 43/10* (2013.01); *H01L 43/12* (2013.01)

(58) Field of Classification Search
CPC ........ H01L 43/08; H01L 43/10; H01L 27/228
See application file for complete search history.

(56) References Cited

U.S. PATENT DOCUMENTS

| | | | | |
|---|---|---|---|---|
| 2008/0239585 A1* | 10/2008 | Ousugi | ................. | B82Y 25/00 360/319 |
| 2010/0176472 A1* | 7/2010 | Shoji | ..................... | B82Y 25/00 257/421 |
| 2012/0023386 A1* | 1/2012 | Oh | ......................... | H01L 43/08 714/769 |
| 2012/0091548 A1 | 4/2012 | Sukegawa et al. | | |
| 2012/0146166 A1* | 6/2012 | Levi | ........................ | H01L 43/08 257/421 |

(Continued)

FOREIGN PATENT DOCUMENTS

| | | |
|---|---|---|
| JP | 3790183 B2 | 6/2006 |
| JP | 2008-288384 A | 11/2008 |

(Continued)

OTHER PUBLICATIONS

National Institute for Materials Science, "AtomWork," retrieved Aug. 2016 <http://crystdb.nims.go.jp/>.

(Continued)

*Primary Examiner* — Nathan W Ha
(74) *Attorney, Agent, or Firm* — Oliff PLC

(57) ABSTRACT

Provided is a magnetoresistance effect device on which a magnetoresistance effect element having an excellent withstand voltage characteristic is mounted. The magnetoresistance effect device includes: an interlayer insulating layer; a through electrode that passes through the interlayer insulating layer and is exposed on at least one surface of the interlayer insulating layer; and a magnetoresistance effect element that is laminated on the through electrode. A Vickers hardness difference between the interlayer insulating layer and the through electrode on a lamination surface on which the magnetoresistance effect element is laminated is 3 GPa or lower.

17 Claims, 6 Drawing Sheets

(56) References Cited

U.S. PATENT DOCUMENTS

| | | | |
|---|---|---|---|
| 2013/0001652 A1* | 1/2013 | Yoshikawa | H01L 43/08 257/252 |
| 2013/0003579 A1 | 1/2013 | Lu et al. | |
| 2013/0241015 A1* | 9/2013 | Nomachi | H01L 43/08 257/421 |
| 2014/0284534 A1* | 9/2014 | Nagase | H01L 43/12 257/1 |
| 2016/0133307 A1* | 5/2016 | Lee | H01L 43/08 257/421 |
| 2016/0163970 A1* | 6/2016 | Xiao | H01L 43/10 438/3 |
| 2016/0210994 A1* | 7/2016 | Sasaki | G11B 5/6088 |
| 2016/0260773 A1* | 9/2016 | Kitagawa | H01L 27/228 |
| 2016/0284980 A1* | 9/2016 | Tonegawa | H01L 43/02 |
| 2016/0308115 A1* | 10/2016 | Kanaya | H01L 27/228 |
| 2016/0308116 A1* | 10/2016 | Noh | H01L 43/02 |
| 2016/0308121 A1* | 10/2016 | Kim | H01L 43/08 |
| 2016/0308122 A1* | 10/2016 | Siddik | H01L 43/08 |
| 2016/0322421 A1* | 11/2016 | Ito | H01L 27/228 |
| 2017/0084829 A1* | 3/2017 | Lee | H01L 43/12 |
| 2017/0194558 A1* | 7/2017 | Lee | G06F 3/0611 |
| 2017/0263679 A1* | 9/2017 | Ozeki | H01L 27/228 |

FOREIGN PATENT DOCUMENTS

| | | |
|---|---|---|
| JP | 5586028 B2 | 9/2014 |
| JP | 5588019 B2 | 9/2014 |

OTHER PUBLICATIONS

Xu et al., "Inorganic Materials Database for Exploring the Nature of Material," Japanese Journal of Applied Physics, 2011, vol. 50, 11RH02, pp. 1-5.

Sukegawa et al., "Tunnel magnetoresistance with improved bias voltage dependence in lattice-matched Fe/spinel MgAl2O4/Fe(001) junctions," Applied Physics Letters, 2010, vol. 96, 212505, pp. 1-3.

Miura et al., "First-principles study of tunneling magnetoresistance in Fe/MgAl2O4/Fe(001) magnetic tunnel junctions," Physical Review B, 2012, vol. 86, 024426, pp. 1-6.

Scheike et al., "Lattice-matched magnetic tunnel junctions using a Heusler alloy Co2FeAl and a cation-disorder spinel Mg—Al—O barrier," Applied Physics Letters, 2014, vol. 105, 242407, pp. 1-5.

Sukegawa et al., "Enhanced tunnel magnetoresistance in a spinel oxide barrier with cation-site disorder," Physical Review B, 2012, vol. 86, 184401, pp. 1-5.

* cited by examiner

MAGNETORESISTANCE EFFECT DEVICE

BACKGROUND OF THE INVENTION

Field of the Invention

The present invention relates to a magnetoresistance effect device.

Priority is claimed on Japanese Patent Application No. 2016-192011, filed Sep. 29, 2016, the content of which is incorporated herein by reference.

Description of Related Art

A giant magnetoresistance (GMR) element that is made of a multilayer film of a ferromagnetic layer and a non-magnetic layer and a tunnel magnetoresistance (TMR) element that uses an insulating layer (a tunnel barrier layer or a barrier layer) for a non-magnetic layer are known. These elements have been spotlighted as elements for a magnetic sensor, a high frequency component, a magnetic head, and a non-volatile random access memory (e.g., an MRAM).

To perform a specific complicated function, integration of a number of elements into one body has been attempted, an example of which is an integrated circuit (IC). An integrated circuit in which numerous devices are three-dimensionally laminated is described in JP-2008-288384A.

Conventionally, a magnetoresistance effect element typified by the TMR element or the GMR element was frequently used for an application of the magnetic head or the like, and that much effort was not put into the integration. However, along with the development of an application as the memory such as an MRAM, requests to incorporate the magnetoresistance effect element into the IC are growing.

SUMMARY OF THE INVENTION

The magnetoresistance effect element is an element in which layers corresponding to several layers of atoms are laminated. For this reason, in comparison with a capacitor, a diode, or the like that is incorporated into the conventional IC, more accurate control is required for the incorporation into the IC.

For example, it is described in JP-2008-288384A that, when the elements are three-dimensionally integrated, a junction of a wafer on which the elements are laminated is made into a flat surface. However, to incorporate the magnetoresistance effect element into the IC, a degree of required flatness differs.

For example, it is described in JP3790183B that subtle asperity of a lamination surface on which the magnetoresistance effect element is laminated causes a reduction in a rate of change of magnetoresistance of the magnetoresistance effect element or a variation in a characteristic thereof. In JP3790183B, to flatten the lamination surface on which the magnetoresistance effect element is laminated, a planarizing conductive layer is provided.

However, to flatten the planarizing conductive layer, there is a need to laminate the planarizing conductive layer having a sufficient thickness, and there is a problem with mass production. In addition, a polished surface needs to have the same composition (see FIG. 4(c) in JP3790183B). Thus, the approach lacks versatility.

Further, when an insulating layer is formed around the planarizing conductive layer, a step (a difference in the level) is formed occasionally at a boundary between the planarizing conductive layer and the insulating layer, and sufficient flatness cannot be realized.

The present invention is made under the above-described circumstances. The object of the present invention is to provide a magnetoresistance effect device on which a magnetoresistance effect element having an excellent withstand voltage characteristic is mounted.

The inventors of the present invention found that, if the lamination surface on which the magnetoresistance effect element is laminated was not sufficiently flattened, the withstand voltage characteristic of the magnetoresistance effect element was reduced.

In the TMR element, a voltage is applied to the tunnel barrier layer that is the insulating layer. For this reason, if a high voltage is applied to the tunnel barrier layer, the tunnel barrier layer gives rise to insulation breakdown, and the TMR may not function as the magnetoresistance effect element. If the flatness of the tunnel barrier layer is inferior, it is believed that either a voltage or a current is not uniformly applied to the entire tunnel barrier layer, which tends to cause the insulation breakdown.

In the magnetoresistance effect element, the tunnel barrier layer is the thinnest layer, and ranges from about 0.7 nm to 3 nm. That is, to solve a new problem with an improvement in withstand voltage characteristic, higher flatness of the lamination surface on which the magnetoresistance effect element is laminated is required.

Therefore, the inventors found that, when a Vickers hardness difference between an interlayer insulating layer and a through electrode on the lamination surface on which the magnetoresistance effect element was laminated was adjusted appropriately, the lamination surface could be flattened to a level to which the magnetoresistance effect element could be laminated.

That is, to solve the above problem, the present invention provides the following means.

(1) A magnetoresistance effect device including: an interlayer insulating layer; a through electrode that passes through the interlayer insulating layer and is exposed on at least one surface of the interlayer insulating layer; and a magnetoresistance effect element laminated on the through electrode, wherein a Vickers hardness difference between the interlayer insulating layer and the through electrode on a lamination surface on which the magnetoresistance effect element is laminated is 3 GPa or less.

(2) In the magnetoresistance effect device according to the above aspect, a height of the through electrode above the interlayer insulating layer from the lamination surface may be 1.5 nm or less.

(3) In the magnetoresistance effect device according to the above aspect, a convex degree obtained by dividing the height by a maximum width of the through electrode above the lamination surface may be 0.015 or less.

(4) In the magnetoresistance effect device according to the above aspect, a material constituting the lamination surface of the through electrode may be a nitride containing any one selected from a group consisting of Ti, Nb, V, Ta, Zr, and Al.

(5) In the magnetoresistance effect device according to the above aspect, the interlayer insulating layer may be either silicon oxide or zirconium oxide.

(6) In the magnetoresistance effect device according to the above aspect, the interlayer insulating layer may be silicon oxide; and a material constituting the lamination surface of the through electrode may be vanadium nitride.

(7) In the magnetoresistance effect device according to the above aspect, the interlayer insulating layer may be zirconium oxide; and a material constituting the lamination surface of the through electrode may be a nitride containing any one selected from a group consisting of Nb, V, and Al.

(8) In the magnetoresistance effect device according to the above aspect, the interlayer insulating layer may be silicon oxide; and a material constituting the lamination surface of the through electrode may be a nitride containing any one selected from a group consisting of Nb, Zr, and Al.

(9) In the magnetoresistance effect device according to the above aspect, the interlayer insulating layer may be any one of chromium nitride, silicon carbonitride, and aluminum oxide; and a material constituting the lamination surface of the through electrode may be a nitride containing Ti or Zr.

(10) In the magnetoresistance effect device according to the above aspect, the magnetoresistance effect device may further include an insulating part that covers a lateral surface of the magnetoresistance effect element, wherein the insulating part may be made of a nitride.

(11) In the magnetoresistance effect device according to the above aspect, the magnetoresistance effect element may be a tunnel magnetoresistance effect element, and a degree of lattice mismatching between a lattice constant of a tunnel barrier layer of the tunnel magnetoresistance effect element and a lattice constant of a crystal structure to be taken by the through electrode may be 5% or less.

(12) In the magnetoresistance effect device according to the above aspect, an electrical resistivity of the through electrode may be 200 μΩ·cm or less.

According to the present invention, a magnetoresistance effect device on which a magnetoresistance effect element having an excellent withstand voltage characteristic is mounted can be provided.

DETAILED DESCRIPTION OF THE INVENTION

Hereinafter, embodiments of the present invention will be described in detail with reference to the attached drawings. In the description of the drawings, the same elements will be given the same reference signs, and duplicate description thereof will be omitted.

[Magnetoresistance Effect Device]

Figure 1:
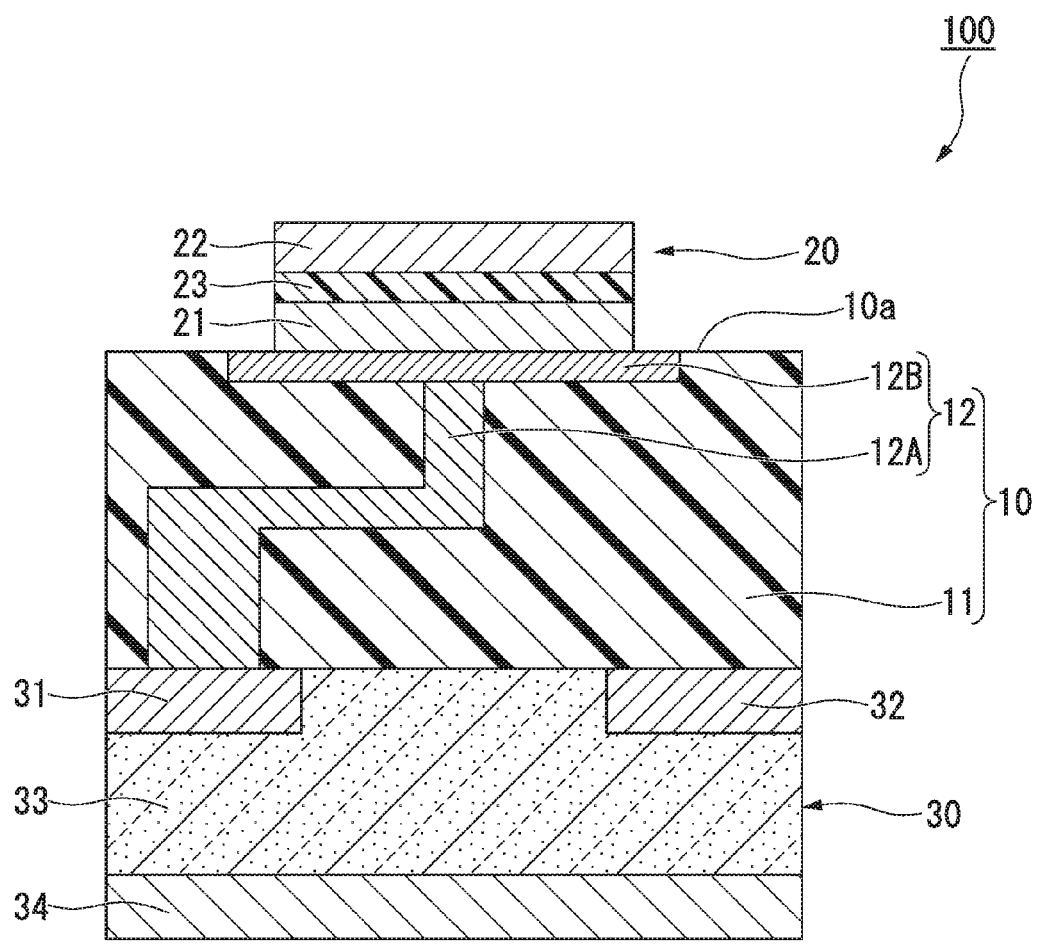
FIG. 1 is a schematic sectional view of a magnetoresistance effect device according to the present embodiment.

FIG. 1 is a schematic sectional view of a magnetoresistance effect device according to the present embodiment. A magnetoresistance effect device 100 illustrated in FIG. 1 has a substrate 10, a magnetoresistance effect element 20, and a semiconductor element 30. The magnetoresistance effect element 20 and the semiconductor element 30 are provided on different surfaces of the substrate 10, and are electrically connected by a through electrode 12 provided inside the substrate 10.

(Substrate)

The substrate 10 has an interlayer insulating layer 11 and the through electrode 12. The through electrode 12 is provided inside the interlayer insulating layer 11, and passes through the interlayer insulating layer 11. The through electrode 12 is electrically connected between a plurality of elements spaced by the interlayer insulating layer 11. In FIG. 1, the magnetoresistance effect element 20 and the semiconductor element 30 are electrically connected.

The interlayer insulating layer 11 is an insulating layer that insulates interconnections of a multilayer interconnection or elements from each other. The same materials used in semiconductor devices and the like can be used as the material of the interlayer insulating layer 11. For example, silicon oxide ($SiO_x$), silicon nitride ($SiN_x$), silicon carbide (SiC), chromium nitride, silicon carbonitride (SiCN), silicon oxy-nitride (SiON), aluminum oxide ($Al_2O_3$), zirconium oxide ($ZrO_x$), etc. may be used.

The through electrode 12 in the magnetoresistance effect device 100 illustrated in FIG. 1 has a current-carrying part 12A and a junction 12B. The junction 12B is a portion joined with the magnetoresistance effect element 20, and the current-carrying part 12A is a portion other than the junction 12B.

The through electrode 12 does not essentially need to be divided into the current-carrying part 12A and the junction 12B. However, since the junction 12B is limited to a selectable material, the through electrode 12 is preferably divided into the current-carrying part 12A and the junction 12B.

A material of which the current-carrying part 12A is formed preferably has high conductivity. For example, copper, aluminum, silver, etc. are preferably used.

The junction 12B is also required to have conductivity. The junction 12B may have lower conductivity than the current-carrying part 12A, but it preferably has an electrical resistivity of 200 Ω·cm or lower.

A material of which the junction 12B is formed is preferably a nitride that contains any one selected from a group consisting of Ti, Nb, V, Ta, Zr, and Al. The magnetoresistance effect element 20 is laminated on the junction 12B. For this reason, the junction 12B also functions as an underlayer of the magnetoresistance effect element 20. If these nitrides are used as the underlayer, crystalline characteristics of each layer of the magnetoresistance effect element 20 are enhanced.

When the junction 12B is made of a nitride, the interlayer insulating layer 11 is preferably any of silicon oxide or zirconium oxide. When the interlayer insulating layer 11 is an oxide film and the junction 12B is the nitride, diffusion of elements is suppressed between the interlayer insulating layer 11 and the junction 12B. If elements of the junction 12B are diffused, this leads to an increase in resistivity of the junction 12B.

The material of which the junction 12B is formed is selected according to the material used for the interlayer insulating layer 11. To be specific, the material for the junction 12B is selected such that a Vickers hardness difference between the interlayer insulating layer 11 and the junction 12B is 3 GPa or less. If the Vickers hardness difference between the interlayer insulating layer 11 and the junction 12B is 3 GPa or less, the lamination surface 10a of the substrate 10 can be sufficiently flattened.

Figure 2:
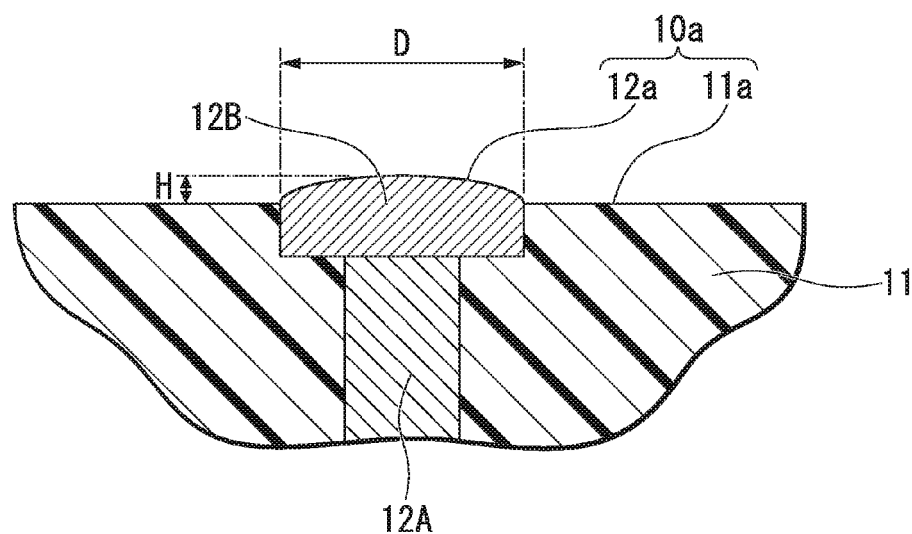
FIG. 2 is a view illustrating a lamination surface of a substrate before a magnetoresistance effect element is laminated.

FIG. 2 is a view illustrating the lamination surface 10a of the substrate 10 before the magnetoresistance effect element 20 is laminated. The lamination surface 10a of the substrate 10 is polished and flattened before the magnetoresistance effect element 20 is laminated. This polishing treatment is also generally preformed on semiconductor devices. For example, chemical mechanical polishing (CMP) is known as a technique in which polishing is performed in the same way using physical and chemical forces even when different substances are present in one surface.

However, each of the layers constituting the magnetoresistance effect element 20 has a thickness of about several nanometers, and even a slight height difference therebetween exerts an influence on the characteristics of the magnetoresistance effect element 20. To be specific, the withstand voltage characteristic of the magnetoresistance effect element 20 is reduced. For this reason, even when CMP is simply performed, sufficient flatness for laminating the magnetoresistance effect element 20 cannot be realized.

Accordingly, the polished lamination surface 10a is homogenized. If the Vickers hardness difference between the interlayer insulating layer 11 and the junction 12B is 3 GPa or less, a state in which the lamination surface 10a is polished by CMP can be made constant, and the lamination surface 10a on which the magnetoresistance effect element 20 is laminated can be flattened.

Here, the sufficient flatness for laminating the magnetoresistance effect element 20 preferably satisfies the following conditions.

The first condition is that a height H of the through electrode 12 from the lamination surface 11a above the interlayer insulating layer 11 is 1.5 nm or less. This height is preferably 1.2 nm or less, and more preferably 1.0 nm or less.

Here, the height H from the lamination surface 11a at the interlayer insulating layer 11 of the through electrode 12 refers to a maximum value of a normal that is drawn from a lamination surface 12a of the through electrode 12 to an extension surface of the lamination surface 11a.

The second condition is that a convex degree obtained by dividing the height H by a maximum width D of the through electrode 12 above the lamination surface 12a of the through electrode 12 is 0.015 or less. The convex degree is preferably 0.012 or less, and more preferably 0.010 or less.

Here, the convex degree is a convex degree in a protruding direction when the through electrode 12 protrudes from the lamination surface 11a at the interlayer insulating layer 11, and is a convex degree in a recessed direction when the through electrode 12 is recessed from the lamination surface 11a at the interlayer insulating layer 11. In addition, the maximum width D refers to the maximum width of the through electrode 12 that is exposed on the lamination surface 12a when the lamination surface 12a is viewed in the top view.

The lamination surface 10a, on which the magnetoresistance effect element 20 is laminated, needs not necessarily satisfy both the first and second conditions, but it preferably satisfies both. By satisfying these together, the withstand voltage characteristic of the laminated magnetoresistance effect element 20 is enhanced.

A specific combination of the interlayer insulating layer 11 and the junction 12B may include the following combinations.

For example, when silicon oxide is used for the interlayer insulating layer 11, vanadium nitride is preferably used for the junction 12B.

When zirconium oxide is used for the interlayer insulating layer 11, a nitride containing any one selected from a group consisting of Nb, V, and Al is preferably used for the junction 12B.

When silicon nitride is used for the interlayer insulating layer 11, a nitride containing any one selected from a group consisting of Nb, Zr, and Al is preferably used for the junction 12B.

When any one of chromium nitride, silicon carbonitride, and aluminum oxide is used for the interlayer insulating layer 11, a nitride containing Ti or Zr is preferably used for the junction 12B.

(Magnetoresistance Effect Element)

The magnetoresistance effect element 20 includes a first ferromagnetic metal layer 21, a second ferromagnetic metal layer 22, and a non-magnetic layer 23 between them (see FIG. 1).

As a material for the first ferromagnetic metal layer 21 and the second ferromagnetic metal layer 22, a ferromagnetic material, and particularly a soft magnetic material is applied. For example, a metal selected from a group consisting of Cr, Mn, Co, Fe, and Ni, an alloy containing one or more metals selected from this group, or an alloy containing one or numerous metals selected from these and at least one element of B, C, and N may be enumerated. To be specific, Co—Fe, Co—Fe—B, or Ni—Fe may be given as an example.

As the material for the first ferromagnetic metal layer 21 and the second ferromagnetic metal layer 22, the Heusler alloy such as $Co_2FeSi$ may be used. Heusler alloys are high in spin polarizability, and can realize a high MR ratio. Heusler alloys include intermetallic compounds having a chemical composition $X_2YZ$. X is a transition metal element of a Co, Fe, Ni, or Cu group or a noble metal element on the periodic table. Y is a transition metal of a Mn, V, Cr, or Ti group, or may also be one of the elements of X. Z is a representative element from group III to group V. For example, $Co_2FeSi$, $Co_2MnSi$, $Co_2Mn_{1-a}Fe_aAl_bSi_{1-b}$, etc. may be enumerated.

When directions in which the first and second ferromagnetic metal layers 21 and 22 are magnetized are perpendicular to the lamination surface, the ferromagnetic material is preferably set to 3 nm or less. Perpendicular magnetic anisotropy can be added to the first and second ferromagnetic metal layers 21 and 22 at interfaces with the non-magnetic layer 23. The perpendicular magnetic anisotropy has an effect attenuated by increasing thicknesses of the first and second ferromagnetic metal layers 21 and 22, and thus the thicknesses of the first and second ferromagnetic metal layers 21 and 22 are preferably reduced.

To make coercivity greater than the first ferromagnetic metal layer 21, an antiferromagnetic material such as IrMn, PtMn, etc. may be used as a material that is in contact with the second ferromagnetic metal layer 22. Further, to prevent a leakage magnetic field of the second ferromagnetic metal layer 22 from affecting the first ferromagnetic metal layer 21, a structure of synthetic antiferromagnetic coupling may be used.

When the direction in which the second ferromagnetic metal layer 22 is magnetized is made perpendicular to the lamination surface, laminated films of Co and Pt are preferably used. For example, when the second ferromagnetic metal layer 22 is set to FeB (1.0 nm)/Ta (0.2 nm)/[Pt (0.16 nm)/Co (0.16 nm)]$_4$/Ru (0.9 nm)/[Co (0.24 nm)/Pt (0.16 nm)]$_6$ from the non-magnetic layer 23 side in turn, the direction of magnetization can be made perpendicular.

In general, the first ferromagnetic metal layer 21 is called a free layer because the direction of magnetization thereof can be more easily changed than that of the second ferromagnetic metal layer 22 by an external magnetic field or spin torque. The second ferromagnetic metal layer 22 has a structure in which the direction of magnetization is fixed, and the first ferromagnetic metal layer 21 is called a fixed layer.

A publicly known material may be used for the non-magnetic layer 23. For example, $Al_2O_3$, $SiO_2$, MgO, $MgAl_2O_4$, etc. may be used. In addition to these, a material or the like in which one of Al, Si, or Mg is substituted with Zn, Be, or the like may be used. Among them, because MgO and $MgAl_2O_4$ are materials in which a coherent tunnel can be realized, a spin can be efficiently injected.

When the non-magnetic layer 23 is a tunnel barrier layer, a degree of lattice mismatching between a lattice constant of the tunnel barrier layer and a lattice constant of a crystal structure which the junction 12B of the through electrode 12 can take is preferably within 5%.

The junction 12B also functions as an underlayer. When the junction 12B is selected with respect to the non-magnetic layer 23, the MR ratio of the magnetoresistance effect element 20 is improved.

This result is contrary to conventional common knowledge. In general, a nitride film formed by a reactive sputtering method is called an amorphous film. The junction 12B formed into a film by the reactive sputtering method becomes an amorphous portion. In actuality, crystallinity of the junction 12B is not observed even in a transmission electron microscope (TEM) image or an electron beam diffraction image.

If the junction 12B is completely amorphous, there is no crystallographic correlation with a layer thereon. In contrast, the MR ratio obtained as a result of examination has a correlation with the junction 12B. The reason for this is thought to be that the junction 12B functioning as the underlayer is neither completely crystallized nor completely amorphous. That is, it is thought that atoms are not regularly arranged at the junction 12B to such a degree as to obtain an image with a TEM or an electron microscope, but that a picture locally having a crystalline portion or having loose regularity leaving a trace of a crystal structure is approximate to reality. With respect to a phenomenon in which the junction 12B formed into a film by the reactive sputtering method is amorphous, adjusting a relation between the junction 12B and the tunnel barrier layer opens a new way of improving the MR ratio of the magnetoresistance effect element.

Here, the "crystal structure which the junction 12B can take on" is a crystal structure that can be taken on when the material of which the junction 12B is formed is made in bulk, and refers to a crystal structure which the junction 12B is thought to have. As described above, the junction 12B is thought to have an intermediate state between a complete crystallized state and an amorphous state. For this reason, it cannot be clearly defined what kind of structure the crystal structure of the junction 12B has. Meanwhile, the actual crystal structure of the junction 12B is not thought to significantly differ from the crystal structure that can be taken on when the material of which the junction 12B is formed is made in bulk. There is a tetragonal structure as the crystal structure which the junction 12B can take on.

The degree of lattice mismatching is defined as follows.

$$\text{Degree of lattice mismatching} = |A - nB|/nB \quad (1)$$

In Formula (1) above, A is the lattice constant of the non-magnetic layer 23, and B is the lattice constant of the crystal structure which the junction 12B can take on. In addition, n is a positive integer or 1/a positive integer.

When the non-magnetic layer 23 is $MgAl_2O_4$ or $ZnAl_2O_4$, the junction 12B is preferably a nitride containing any one selected from a group consisting of Ti, V, and Al.

When the non-magnetic layer 23 is MgO, the junction 12B is preferably a nitride containing any one selected from a group consisting of Ti, Nb, V, and Ta.

When the non-magnetic layer 23 is $\gamma$-$Al_2O_3$ or $Mg_{0.5}Al_2O_4$, the junction 12B is preferably a nitride containing any one selected from a group consisting of V and Al.

When the non-magnetic layer 23 is $MgGa_2O_4$ or $ZnGa_2O_4$, the junction 12B is preferably a nitride containing any one selected from a group consisting of Ti, V, Ta, and Al.

When the non-magnetic layer 23 is $ZnIn_2O_4$, the junction 12B is preferably a nitride containing any one selected from a group consisting of Nb, Ta, and Zr.

When the non-magnetic layer 23 is $CdAl_2O_4$ or $CdGa_2O_4$, the junction 12B is preferably a nitride containing any one selected from a group consisting of Ti, Nb, V, and Ta.

The magnetoresistance effect element 20 may have a publicly known layer other than the first ferromagnetic metal layer 21, the non-magnetic layer 23, and the second ferromagnetic metal layer 22. For example, the magnetoresistance effect element 20 may have a cap layer or the like for enhancing crystal orientation or stability of magnetism.

The magnetoresistance effect element 20 illustrated in FIG. 1 is given as an example of a so-called top pin structure in which the first ferromagnetic metal layer 21 is used as a magnetized free layer and the second ferromagnetic metal layer 22 is used as a magnetized fixed layer. However, the structure of the magnetoresistance effect element 20 is not particularly limited.

The magnetized fixed layer is typically made up of a plurality of layers. Thus, in the case of the magnetized fixed layer, the first ferromagnetic metal layer 21 sandwiches many layers between the junction 12B and the non-magnetic layer 23, and thereby a relation between the junction 12B and the non-magnetic layer 23 is reduced. In contrast, in the case of the top pin structure, a coercivity of the first ferromagnetic metal layer 21 is reduced, but the first ferromagnetic metal layer 21 merely sandwiches a magnetized free layer that is a single layer between the junction 12B and the non-magnetic layer 23, and an influence which the junction 12B exerts on the non-magnetic layer 23 is increased. For this reason, a so-called bottom pin structure in which, depending on the material of which the junction 12B is formed, the first ferromagnetic metal layer 21 is used as a magnetized fixed layer and the second ferromagnetic metal layer 22 is used as a magnetized free layer may be used.

Figure 3:
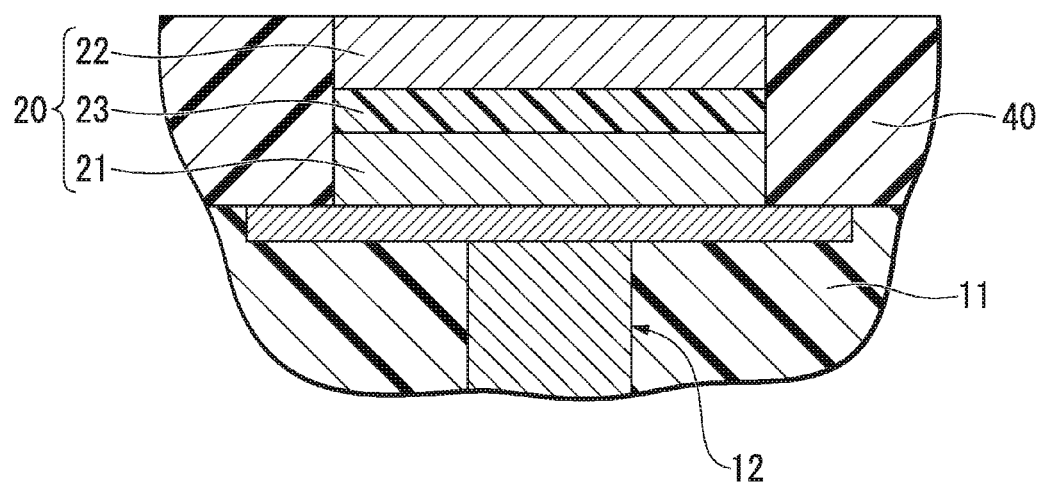
FIG. 3 is a schematic view in which the vicinity of the magnetoresistance effect element of the magnetoresistance effect device is enlarged.

FIG. 3 is a schematic view in which the vicinity of the magnetoresistance effect element of the magnetoresistance effect device is enlarged. When an element or the like is further laminated on the magnetoresistance effect element 20, an insulating part 40 may be provided on a lateral surface of the magnetoresistance effect element 20 as illustrated in FIG. 3. The insulating part 40 prevents the magnetoresistance effect element 20 from being short-circuited from a lateral surface side. Here, the lateral surface of the magnetoresistance effect element 20 is a surface that is exposed in an in-plane direction perpendicular to the laminating direction of the magnetoresistance effect element 20.

The same material as the interlayer insulating layer 11 in the substrate 10 can be used for the insulating part 40. When the non-magnetic layer 23 is a tunnel barrier layer of MgO or $MgAl_2O_4$, the material of which the insulating part 40 is formed is preferably a nitride having an insulation property. The insulating part 40 is made of a nitride, and thereby oxygen or Mg ions constituting the tunnel barrier layer are prevented from being diffused to the insulating part 40.

(Semiconductor Element)

The semiconductor element 30 illustrated in FIG. 1 is an FET transistor having a source electrode 31, a drain electrode 32, a semiconductor part 33, and a gate electrode 34. The semiconductor element 30 is electrically connected with the magnetoresistance effect element 20 via the through electrode 12.

The semiconductor element 30 is not limited to the FET transistor illustrated in FIG. 1, and may be a resistor element, a capacitor, or the like. In place of the semiconductor element 30, another element and another member may be connected.

Figure 4:
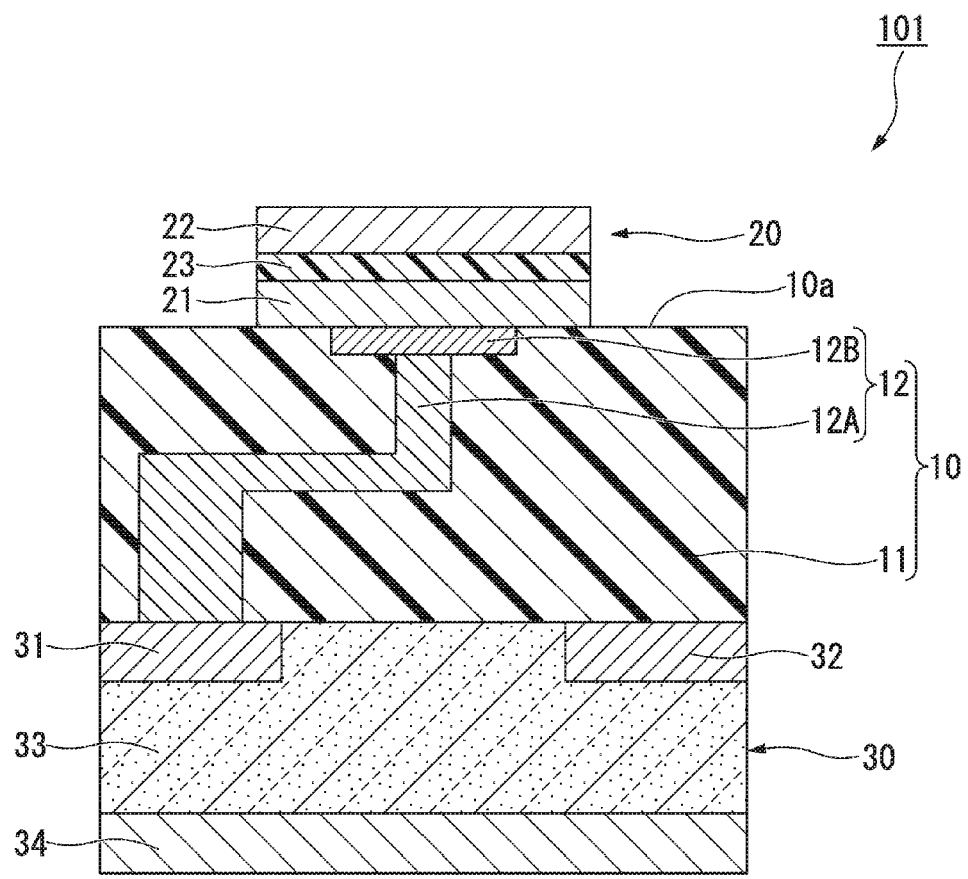
FIG. 4 is a schematic sectional view of another example of the magnetoresistance effect device according to the present embodiment.

FIG. 4 is a schematic sectional view of another example of the magnetoresistance effect device according to the present embodiment. A magnetoresistance effect device 101 illustrated in FIG. 4 has a magnetoresistance effect element 20 laminated across a junction 12B and an interlayer insulating layer 11. Even in this case, the laminated magnetoresistance effect element 20 is affected by a convex degree of the junction 12B and a height difference in a boundary between the junction 12B and the interlayer insulating layer 11, and thus there is a need to sufficiently planarize a lamination surface 10a.

(Method of Fabricating the Magnetoresistance Effect Device)

Next, a method of fabricating the magnetoresistance effect device will be described on the basis of FIG. 1.

First, a semiconductor element 30 is prepared. The semiconductor element 30 may be an element purchased on the market or may be fabricated by a publicly known method. For example, a semiconductor substrate is prepared, a metal film is formed on one surface thereof, and a gate electrode 34 is made. Ions are injected into a part of the semiconductor substrate, and thereby a source electrode 31 and a drain electrode 32 are made.

Next, a substrate 10 is formed on the semiconductor element 30. The substrate 10 is made by a photolithographic method. First, a metal layer is laminated on one surface of the semiconductor element 30, and an unnecessary portion is removed by pattern etching. An insulator is laminated at the removed portion. This is repeated more than once, and thereby an interlayer insulating layer 11 and a through electrode 12 are made. The through electrode 12 and the interlayer insulating layer 11 may be laminated by means such as sputtering.

A lamination surface 10a of the made substrate 10 is polished. The polishing may be performed by, for instance, CMP. Since the interlayer insulating layer 11 and the through electrode 12 have a Vickers hardness difference of 3 GPa or lower, the lamination surface 10a is polished and flattened to a level to which a magnetoresistance effect element 20 can be laminated.

Finally, the magnetoresistance effect element 20 is laminated on the flattened lamination surface 10a. The magnetoresistance effect element 20 may be made by a publicly known method. For example, a first ferromagnetic metal layer 21, a non-magnetic layer 23, and a second ferromagnetic metal layer 22 are laminated by means such as sputtering, and then are subjected to heat treatment. Crystallization of each layer is accelerated by the heat treatment. The non-magnetic layer 23 is made into a tunnel barrier layer by sputtering a metal thin film and performing plasma oxidation or spontaneous oxidation caused by oxygen introduction.

The magnetoresistance effect element 20 fabricated by the heat treatment has an improved MR ratio compared to the magnetoresistance effect element 20 fabricated without the heat treatment. The heat treatment is preferably performed under conditions of a temperature of 300° C. or higher and 500° C. or lower, and a heating time of 5 minutes or more and 100 minutes or less in an inert atmosphere of Ar or the like, and then under conditions of a temperature of 100° C. or higher and 500° C. or lower, and a heating time of 1 hour or more and 10 hours or less in a state in which a magnetic field of 2 kOe or higher and 10 kOe or lower is applied.

As described above, according to the magnetoresistance effect device 100 relating to the present embodiment, the lamination surface 10a on which the magnetoresistance effect element 20 is laminated can be flattened with higher accuracy. As a result, the magnetoresistance effect element 20 is made homogeneously, and the withstand voltage characteristic is enhanced.

Although a preferred embodiment of the present invention has been described in detail, the present invention is not limited to a specific embodiment, and can be changed and modified in various ways without departing from the spirit and scope of the present invention described in the claims.

Examples

<Relation Between the Through Electrode and the Interlayer Insulating Layer>

The materials used for the through electrode and the interlayer insulating layer were modified to obtain a height H from the lamination surface and a convex degree (a height H/a maximum width D) at the interlayer insulating layer of the through electrode. The magnetoresistance effect element was laminated on the lamination surface, and characteristics of the magnetoresistance effect element were evaluated. The results of the evaluation are summarized in Tables 1 and 2 below.

(Constitution of the Magnetoresistance Effect Device)

Figure 5:
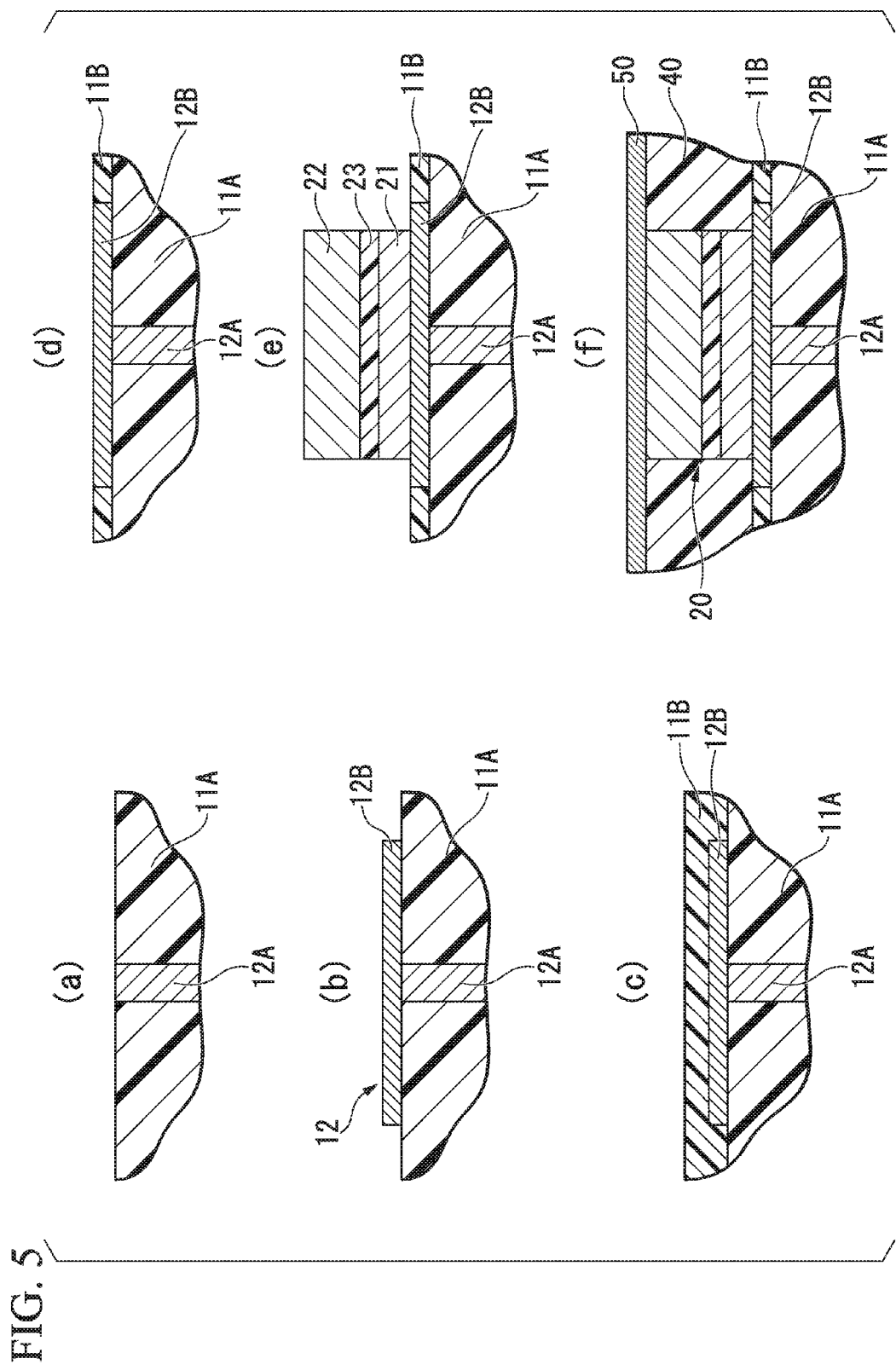
FIG. 5 is a view illustrating a process of fabricating the magnetoresistance effect device, and is a view in which the vicinity of the magnetoresistance effect element is enlarged.

The magnetoresistance effect device used for examination of the examples will be described on the basis of FIG. 5. FIG. 5 is a view illustrating a process of fabricating the magnetoresistance effect device, and is a view in which the vicinity of the magnetoresistance effect element is enlarged.

First, a current-carrying part 12A that is connected to a source electrode of a FET transistor and is made of Cu and a first insulating layer 11A made of silicon oxide were made by photolithography (FIG. 5(*a*)).

Next, a layer having a thickness of 5 nm was laminated on the current-carrying part 12A and the interlayer insulating part 11A. A resist film was formed on the laminated layer, and an unnecessary portion was removed to form a junction 12B having a diameter of 100 nm (FIG. 5(*b*)). That is, a maximum width D of a through electrode 12 was 100 nm. A material of the junction 12B for each of the examples and comparative examples is represented in Tables 1 and 2.

Next, a second insulating layer 11B was laminated to cover the junction 12B (FIG. 5(*c*)), and a material of the second insulating layer 11B for each of the examples and comparative examples was the interlayer insulating layer shown in Tables 1 and 2. A lamination surface of the second insulating layer 11B was polished by CMP until the junction 12B was exposed (FIG. 5(d)). The interlayer insulating layer was made up of the first insulating layer 11A and the second insulating layer 11B.

Then, $Co_{74}Fe_{26}$ (a thickness of 2 nm) acting as a first ferromagnetic metal layer 21, MgO or $MgAl_2O_4$ (a thickness of 1.8 nm) acting as a non-magnetic layer, CoFe (a thickness of 7 nm)/Ru (a thickness of 0.8 nm)/CoFe (a thickness of 10 nm)/IrMn (a thickness of 12 nm) acting as a second ferromagnetic metal layer, and Ru (a thickness of 3 nm)/Ta (a thickness of 5 nm) acting as a cap layer were laminated in turn. An unnecessary portion was removed by photolithography, and a columnar magnetoresistance effect element 20 having a diameter of 80 nm was made (FIG. 5(e)).

Further, an insulator was laminated to cover the magnetoresistance effect element 20. A lamination surface of the insulator was polished by CMP until one surface of the magnetoresistance effect element 20 was exposed, and an insulating part 40 was made. A material of which the insulating part 40 was formed was identical to that of the second insulating layer 11B.

Finally, an upper electrode 50 was made on exposed surfaces of the insulating part 40 and the magnetoresistance effect element 20. A material of which the upper electrode 50 was formed was Ru (a thickness of 3 nm)/Ta (a thickness of 5 nm)/Cu (a thickness of 200 nm).

(Determination of the Lattice Constant of the Junction)

A lattice constant of the junction (the underlayer) was obtained using a site of "AtomWork," (Retrieved on August 23, Hei28(2016), URL: http://crystdb.nims.go.jp/) provided by National Institute for Materials Science (Japan). The junction using the nitride of the present example was an amorphous structure, and a crystal structure thereof cannot be analyzed. To verify a relation between crystal lattices of the tunnel barrier layer and the junction, in the respective nitrides from the site of "Atom Work," (Retrieved on August 23, Hei28(2016), URL: http://crystdb.nims.go.jp/) provided by National Institute for Materials Science (Japan), the lattice constant of the result in which a crystal structure was a NaCl structure and a space group was Fm-3m was as shown in Tables 1 and 2.

(Determination of the Lattice Constant of the Tunnel Barrier Layer)

For a structure analysis of the tunnel barrier layer, a crystal structure and a lattice constant were evaluated.

The crystal structure was evaluated by an electron diffraction pattern using a transmission electron beam. In a case in which spinel materials other than MgO were used, when a structure of the barrier layer was checked by this method, there was no reflection from {022} planes represented with an ordered spinel structure. In this case, the barrier layer was regarded to have a spinel structure in which cubic cations were disordered (a Sukenel structure).

The lattice constant of the tunnel barrier layer was evaluated using a four-axis X-ray diffractometer. In the evaluation of the lattice constant, it was difficult to decide the lattice constant with a thickness of the tunnel barrier layer of the example.

For this reason, to obtain the lattice constant as preliminary measurement, a substrate in which the tunnel barrier layer (a thickness of 100 nm) was formed on a Si substrate with a thermally oxidized film was used. The Si substrate with a thermally oxidized film had a surface that was amorphous SiOx, and was hardly affected when the tunnel barrier layer was formed. The tunnel barrier layer (a thickness of 100 nm) had a film thickness at which an influence on lattice distortion caused by the substrate was sufficiently relieved, and at which X-ray strength for a sufficient structure analysis could be obtained.

Further, in the example, an underlayer, a first ferromagnetic metal layer, and a tunnel barrier layer were formed in turn.

In this case, a crystal lattice of the underlayer exerted an influence on the tunnel barrier layer via the first ferromagnetic metal layer. Therefore, when the first ferromagnetic metal layer was not affected by the crystal lattice from the underlayer, no influence was exerted on the tunnel barrier layer. In the present example, a thickness of the first ferromagnetic metal layer was at least set to 10 nm or less, and was set to a thickness at which the influence of the crystal lattice of the underlayer exerted an influence on the tunnel barrier layer via the first ferromagnetic metal layer. To be specific, a thickness of the tunnel barrier layer was set to 5 nm.

Therefore, the film thickness obtained in the example was not completely consistent with the preliminary measurement, but conditions other than the fact that the influence from the underlayer and the film thickness were different were consistent. The lattice constant obtained from the preliminary measurement can be regarded as the lattice constant obtained in the example. The lattice constant was obtained by setting the tunnel barrier layer as a rock salt type structure in the case of MgO and otherwise as a Sukenel structure in the cases of $MgAl_2O_4$, $ZnAl_2O_4$, and $\gamma$-$Al_2O_3$.

(Method for Obtaining the Vickers Hardness)

The Vickers hardness was obtained by a micro-Vickers hardness test. A layer of the same material as the junction having a thickness of 5 µm was formed on a Si substrate. The Si substrate was removed by chemical etching, ion milling, or polishing, and the layer of the same material as the junction was obtained. The Vickers hardness was obtained by bringing a diamond square pyramid indentor having a facing angle of 136 degrees into contact with the made layer. The Vickers hardness H was a value obtained by dividing a load F [N] by a dented surface area S [$m^2$], and General Formula (2) below was obtained from a dented diagonal length d [m] to be measured.

$$H = \frac{F}{S} = 1.854 \times \frac{F}{d^2} \qquad (2)$$

In the micro-Vickers hardness test, there was a need to take into account a relation between a depth of a dent and a thickness of the made layer. A test load varied between $1 \times 10^{-2}$ N and 20 N, and a region in which a hardness was nearly constant was defined as a Vickers hardness of the made layer, that is, a Vickers hardness of the junction. A thickness of a layer corresponding to the junction for evaluation was thin, and the layer corresponding to the junction cracked when the test load was increased, and therefore the evaluation could not be performed. When the test load was excessively reduced, the dent formed in the layer corresponding to the junction gave rise to elastic recovery, and the Vickers hardness was estimated to be great because a real dent and an experimental value were different.

(Method for Evaluating the Withstand Voltage)

A withstand voltage characteristic of the magnetoresistance effect element 20 was evaluated by connecting a current source 71 and a voltmeter 72 to the upper electrode 50 and the junction 12B, and applying a fixed voltage to the magnetoresistance effect element 20. A current flowing to the magnetoresistance effect element 20 was observed, and thereby a withstand voltage was obtained.

The withstand voltage was defined as a voltage at which the function of the magnetoresistance effect element 20 failed because the voltage was applied to the magnetoresistance effect element 20, the element was broken, and a magnetoresistance effect was not discovered, or because the non-magnetic layer 23 was broken and electric resistance was greatly changed.

The applied voltage was increased from 0.1 V in units of 0.1 V. The voltage applied to the magnetoresistance effect element 20 was set to 10 ns as an applied time, and was applied 10 times at measurement intervals of 1 ms or more in single measurement. In a case in which the non-magnetic layer of the magnetoresistance effect element 20 was a tunnel barrier layer, when a current flowed, the magnetoresistance effect element 20 generated heat. The generation of heat exerted an influence on a magnetoresistance ratio or a critical current for magnetization reversal, and there was a fear of an influence on the withstand voltage characteristic.

Since it was known that an effect of generating heat became remarkable when the applied time exceeded 10 ms, the single measurement was set to 10 ns, and a measurement interval was set to 1 ms or more in order to secure a sufficient time for heat radiation.

In each example, the evaluation of the withstand voltage was performed on 10 elements measured in the same way. Currents were evaluated with the respective voltages, and the evaluation was performed with an applied voltage from 0.1 V to 3 V. Among the 10 elements, the element broken down obviously at a lower voltage than the other elements was presumed to be broken by pinholes of the tunnel barrier layer, and was excluded from the results of the evaluation of the withstand voltage, and new results of the alternative element were used. When the applied voltage was increased in all the elements, a large current flowed abruptly. However, a phenomenon in which no current flowed was observed, and a voltage at which this phenomenon was observed was used as the withstand voltage.

TABLE 1

| | Non-magnetic layer Material | Junction Material | Junction Vickers hardness (Hv) | Interlayer insulating layer Material | Interlayer insulating layer Vickers hardness (Hv) | Vickers hardness difference (absolute value) | Height H (nm) | Convex degree H/D | Withstand voltage (V) |
|---|---|---|---|---|---|---|---|---|---|
| Comparative Example 1-1 | MgAl$_2$O$_4$ | TiN | 20.1 | SiOx | 9.8 | 10.3 | 2.80 | 0.0280 | 2.04 |
| Comparative Example 1-2 | | NbN | 14.3 | | | 4.5 | 1.79 | 0.0179 | 2.25 |
| Example 1-1 | | VN | 12.8 | | | 3.0 | 1.10 | 0.0110 | 2.56 |
| Comparative Example 1-3 | | TaN | 23.7 | | | 13.9 | 3.00 | 0.0300 | 1.98 |
| Comparative Example 1-4 | | ZrN | 16.5 | | | 6.7 | 2.10 | 0.0210 | 2.26 |
| Comparative Example 1-5 | | AlN | 14.0 | | | 4.2 | 1.96 | 0.0196 | 2.32 |
| Comparative Example 2-1 | MgO | TiN | 20.1 | SiNx | 16.0 | 4.1 | 1.70 | 0.0170 | 1.90 |
| Example 2-1 | | NbN | 14.3 | | | 1.2 | 0.83 | 0.0083 | 2.18 |
| Comparative Example 2-2 | | VN | 12.8 | | | 3.2 | 1.67 | 0.0167 | 1.87 |
| Comparative Example 2-3 | | TaN | 23.7 | | | 7.7 | 2.53 | 0.0253 | 1.84 |
| Example 2-2 | | ZrN | 16.5 | | | 0.5 | 0.54 | 0.0054 | 2.20 |
| Example 2-3 | | AlN | 14.0 | | | 2.0 | 0.65 | 0.0065 | 2.08 |
| Example 3-1 | MgO | TiN | 20.1 | SiC | 23.0 | 2.9 | 1.16 | 0.0116 | 2.00 |
| Comparative Example 3-1 | | NbN | 14.3 | | | 8.7 | 3.12 | 0.0312 | 1.83 |
| Comparative Example 3-2 | | VN | 12.8 | | | 10.2 | 3.45 | 0.0345 | 1.72 |
| Example 3-2 | MgAl$_2$O$_4$ | TaN | 23.7 | | | 0.7 | 0.58 | 0.0058 | 2.96 |
| Comparative Example 3-3 | | ZrN | 16.5 | | | 6.5 | 2.88 | 0.0288 | 2.10 |
| Comparative Example 3-4 | | AlN | 14.0 | | | 9.0 | 3.32 | 0.0332 | 1.94 |
| Example 4-1 | MgAl$_2$O$_4$ | TiN | 20.1 | CrN | 18.0 | 2.1 | 0.83 | 0.0083 | 2.78 |
| Comparative Example 4-1 | | NbN | 14.3 | | | 3.7 | 1.80 | 0.0180 | 2.28 |
| Comparative Example 4-2 | | VN | 12.8 | | | 5.2 | 2.75 | 0.0275 | 2.15 |
| Comparative Example 4-3 | | TaN | 23.7 | | | 5.7 | 2.50 | 0.0250 | 2.30 |
| Example 4-2 | | ZrN | 16.5 | | | 1.5 | 0.85 | 0.0085 | 2.74 |
| Comparative Example 4-4 | | AlN | 14.0 | | | 4.0 | 1.90 | 0.0190 | 2.03 |

TABLE 2

| | Non-magnetic layer Material | Junction Material | Junction Vickers hardness (Hv) | Interlayer insulating layer Material | Interlayer insulating layer Vickers hardness (Hv) | Vickers hardness difference (absolute value) | Height H (nm) | Convex degree H/D | Withstand voltage (V) |
|---|---|---|---|---|---|---|---|---|---|
| Example 5-1 | MgAl$_2$O$_4$ | TiN | 20.1 | SiCN | 19.0 | 1.1 | 0.73 | 0.0073 | 2.86 |
| Comparative Example 5-1 | | NbN | 14.3 | | | 4.7 | 2.34 | 0.0234 | 2.13 |
| Comparative Example 5-2 | | VN | 12.8 | | | 6.2 | 2.43 | 0.0243 | 2.00 |
| Comparative Example 5-3 | | TaN | 23.7 | | | 4.7 | 2.00 | 0.0200 | 2.34 |
| Example 5-2 | | ZrN | 16.5 | | | 2.5 | 0.91 | 0.0091 | 2.66 |
| Comparative Example 5-4 | | AlN | 14.0 | | | 5.0 | 2.00 | 0.0200 | 2.46 |
| Example 6-1 | MgAl$_2$O$_4$ | TiN | 20.1 | Al$_2$O$_3$ | 18.0 | 2.1 | 0.86 | 0.0086 | 2.66 |
| Comparative Example 6-1 | | NbN | 14.3 | | | 3.7 | 1.54 | 0.0154 | 2.10 |
| Comparative Example 6-2 | | VN | 12.8 | | | 5.2 | 2.32 | 0.0232 | 2.13 |
| Comparative Example 6-3 | | TaN | 23.7 | | | 5.7 | 2.14 | 0.0214 | 2.33 |
| Example 6-2 | | ZrN | 16.5 | | | 1.5 | 0.84 | 0.0084 | 2.83 |

TABLE 2-continued

| | | Junction | | Interlayer insulating layer | | Vickers hardness difference (absolute value) | Height H (nm) | Convex degree H/D | Withstand voltage (V) |
|---|---|---|---|---|---|---|---|---|---|
| | Non-magnetic layer Material | Material | Vickers hardness (Hv) | Material | Vickers hardness (Hv) | | | | |
| Comparative Example 6-4 | | AlN | 14.0 | | | 4.0 | 2.10 | 0.0210 | 2.21 |
| Comparative Example 7-1 | MgO | TiN | 20.1 | $ZrO_2$ | 12.0 | 8.1 | 2.40 | 0.0240 | 1.83 |
| Example 7-1 | | NbN | 14.3 | | | 2.3 | 0.78 | 0.0078 | 1.95 |
| Example 7-2 | | VN | 12.8 | | | 0.8 | 0.64 | 0.0064 | 2.15 |
| Comparative Example 7-2 | | TaN | 23.7 | | | 11.7 | 2.86 | 0.0286 | 1.80 |
| Comparative Example 7-3 | | ZrN | 16.5 | | | 4.5 | 1.85 | 0.0185 | 1.87 |
| Example 7-3 | | AlN | 14.0 | | | 2.0 | 0.92 | 0.0092 | 2.04 |
| Comparative Example 8-1 | MgO | Cu | 0.8 | SiOx | 9.8 | 9.0 | 3.80 | 0.0380 | 1.78 |
| Comparative Example 8-2 | $MgAl_2O_4$ | Cu | 0.8 | | | 9.0 | 3.90 | 0.0390 | 2.04 |

As represented in Tables 1 and 2, if the Vickers hardness difference is 3 GPa or less, the height H is reduced close to 1 nm, and the lamination surface is sufficiently flattened. Due to the planarization of the lamination surface, even when a voltage exceeding 1.90 V is applied when the non-magnetic layer is MgO, the magnetoresistance effect element can withstand the voltage, and even when a voltage exceeding 2.50 V is applied when the non-magnetic layer is $MgAl_2O_4$, the magnetoresistance effect element can withstand the voltage. That is, the withstand voltage characteristic of the magnetoresistance effect element is improved. $MgAl_2O_4$ had a disordered spinel structure.

Figure 6:
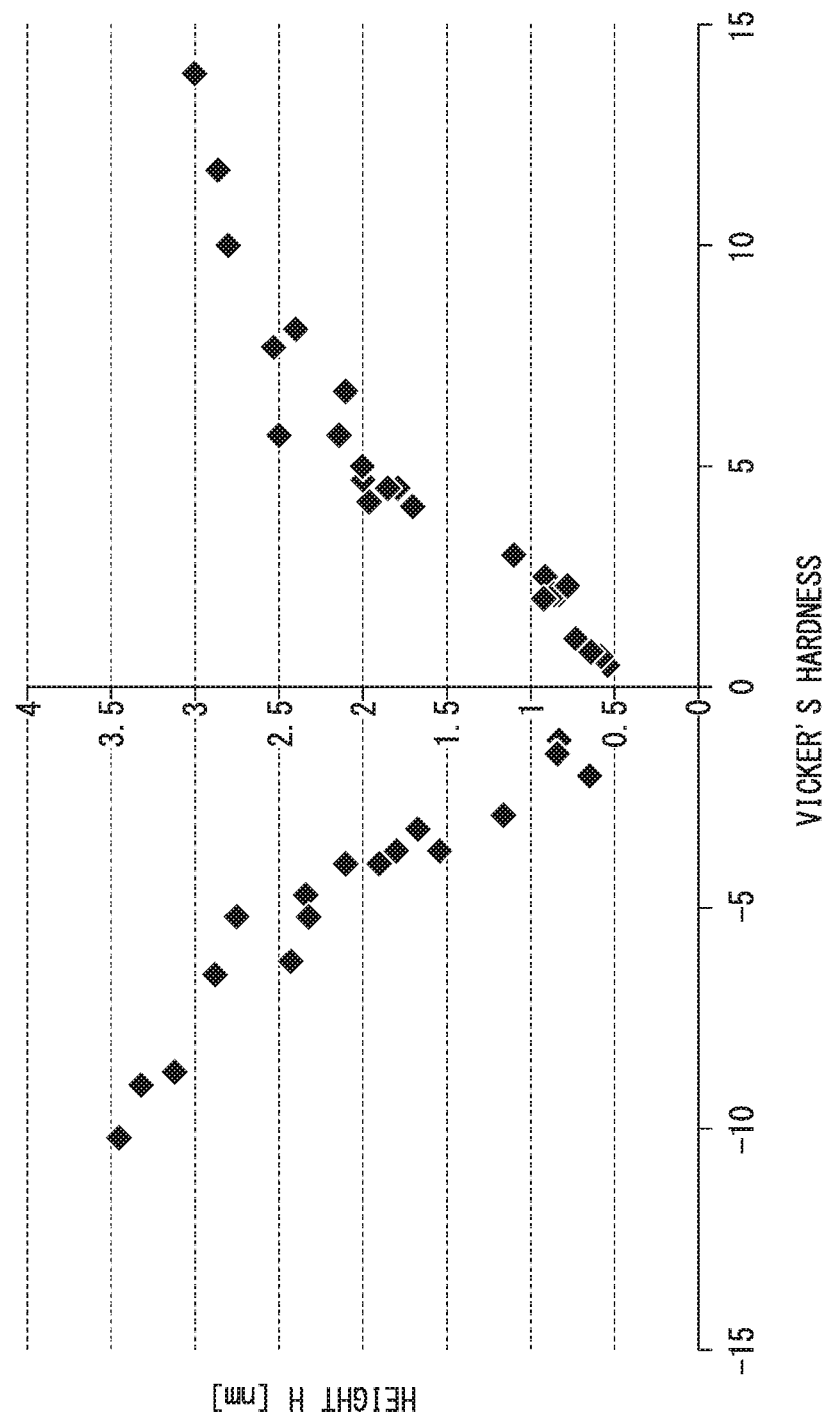
FIG. 6 is a graph illustrating a degree of flatness of the lamination surface with respect to a Vickers hardness difference between a through electrode and a junction.
Figure 7:
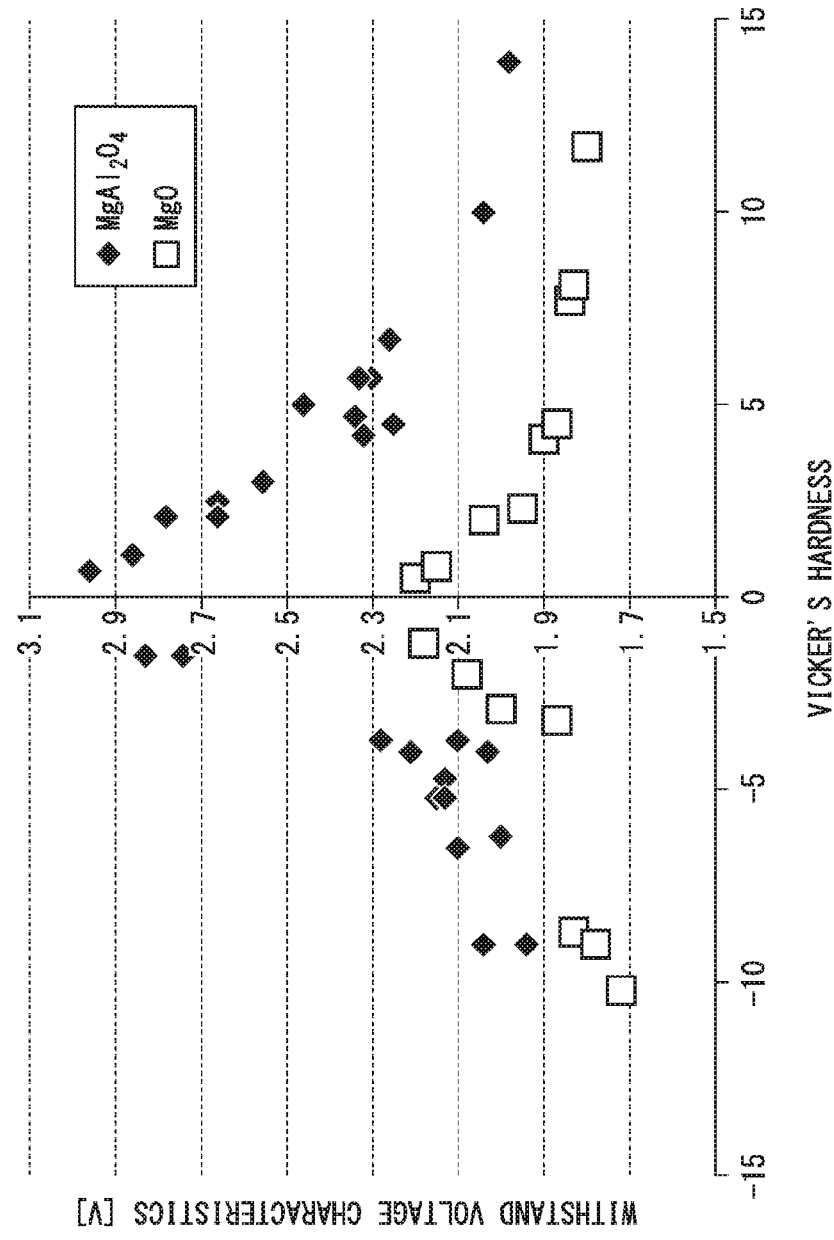
FIG. 7 is a graph illustrating a withstand voltage characteristic of the magnetoresistance effect element with respect to the Vickers hardness difference between the through electrode and the junction.

The results of Tables 1 and 2 are outlined in a graph in FIGS. 6 and 7. FIG. 6 is a graph illustrating a degree of flatness of the lamination surface with respect to the Vickers hardness difference between the through electrode and the junction, and FIG. 7 is a graph illustrating the withstand voltage characteristic of the magnetoresistance effect element with respect to the Vickers hardness difference between the through electrode and the junction.

(Relation Between the Junction and the Non-Magnetic Layer)

A degree of lattice mismatching was calculated by modifying the junction and the non-magnetic layer. A lattice constant was obtained on the presumption that the junction had a tetragonal structure. In the case of the non-magnetic layer, a lattice constant was obtained on the presumption that MgO had a rock salt type structure and the other materials had a Sukenel structure.

TABLE 3

| Junction | Lattice constant [nm] | Non-magnetic layer | Lattice constant [nm] |
|---|---|---|---|
| TiN | 0.4241 | MgO | 0.4213 |
| NbN | 0.4391 | $MgAl_2O_4$ | 0.4042 |
| VN | 0.4135 | $\gamma$-$Al_2O_3$ | 0.3955 |
| TaN | 0.4330 | $ZnAl_2O_4$ | 0.4031 |
| ZrN | 0.4573 | $Mg_{0.5}Al_2O_4$ | 0.3999 |
| AlN | 0.3956 | $MgGa_2O_4$ | 0.4142 |
| CeN | 0.5021 | $ZnGa_2O_4$ | 0.4168 |
| | | $ZnIn_2O_4$ | 0.4465 |
| | | $CdAl_2O_4$ | 0.4178 |
| | | $CdGa_2O_4$ | 0.4308 |

A degree of lattice mismatching between the underlayer and the tunnel barrier layer was obtained from the results of the lattice constants represented in Table 3. The results are represented in Table 4.

TABLE 4

| | | Junction | | | | | | |
|---|---|---|---|---|---|---|---|---|
| | | TiN | NbN | VN | TaN | ZrN | AlN | CeN |
| Non-magnetic layer | MgO | 0.7 | 4.1 | 1.9 | 2.7 | 7.9 | 6.5 | 16.1 |
| | $MgAl_2O_4$ | 4.7 | 8.0 | 2.3 | 6.7 | 11.6 | 2.2 | 19.5 |
| | $\gamma$-$Al_2O_3$ | 6.7 | 9.9 | 4.3 | 8.7 | 13.5 | 0.0 | 21.2 |
| | $ZnAl_2O_4$ | 5.0 | 8.2 | 2.5 | 6.9 | 11.9 | 1.9 | 19.7 |
| | $Mg_{0.5}Al_2O_4$ | 5.7 | 9.0 | 3.3 | 7.7 | 12.6 | 1.1 | 20.4 |
| | $MgGa_2O_4$ | 2.3 | 5.7 | 0.2 | 4.3 | 9.4 | 4.7 | 17.5 |
| | $ZnGa_2O_4$ | 1.8 | 5.1 | 0.8 | 3.8 | 8.9 | 5.3 | 17.0 |
| | $ZnIn_2O_4$ | 5.3 | 1.7 | 8.0 | 3.1 | 2.4 | 12.9 | 11.0 |
| | $CdAl_2O_4$ | 1.5 | 4.9 | 1.0 | 3.5 | 8.6 | 5.6 | 16.8 |
| | $CdGa_2O_4$ | 1.6 | 1.9 | 4.2 | 0.5 | 5.8 | 8.9 | 14.2 |

Next, a resistance area (RA) and an MR ratio of the magnetoresistance effect element for some of the above examples and comparative examples were measured. A relation between the measured MR ratio and the degree of lattice mismatching is represented in Table 5.

The RA is standardized with a resistance value in a unit area by dividing a resistance value, which is obtained by dividing an applied bias voltage by a current flowing in the laminating direction of the magnetoresistance effect element, by an area of a surface on which each layer is joined, and a unit thereof is $\Omega \cdot \mu m^2$. The applied bias voltage and a value of the current flowing in the laminating direction of the magnetoresistance effect element can be measured and obtained by a voltmeter and an ammeter.

TABLE 5

| | Junction | Tunnel barrier layer | Degree of lattice mismatching | RA | MR ratio |
|---|---|---|---|---|---|
| Example 1-1 | VN | $MgAl_2O_4$ | 2.3 | 0.6 | 120.8 |
| Comparative Example 1-1 | TiN | $MgAl_2O_4$ | 4.7 | 0.69 | 106.8 |
| Comparative Example 1-3 | TaN | $MgAl_2O_4$ | 6.7 | 0.73 | 68.2 |

Next, comparing Example 1-1, Comparative Example 1-1, and Comparative Example 1-3, it is found that, when the degree of lattice mismatching is increased, the MR ratio is improved. That is, in Table 3 above, if the degree of lattice mismatching is 5% or less, the MR ratio can be realized. If the degree of lattice mismatching is 3% or less, a very high MR ratio can be realized. Example 1-1 also has an excellent withstand voltage characteristic in Table 1, and can be said to be especially preferred as a combination of the junction (the underlayer), the interlayer insulating layer, and the tunnel barrier layer. In addition to this, the combinations of Example 2-1, Example 3-1, Example 7-2, and Example 7-3 can be said to be excellent combinations in which the degree of lattice mismatching is high and the withstand voltage characteristic is also high.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

EXPLANATION OF REFERENCES

10: Substrate
11: Interlayer insulating layer
11A: First insulating layer
11B: Second insulating layer
12: Through electrode
12A: Current-carrying part
12B: Junction
20: Magnetoresistance effect element
21: First ferromagnetic metal layer
22: Second ferromagnetic metal layer
23: Non-magnetic layer
30: Semiconductor element
31: Source electrode
32: Drain electrode
33: Semiconductor part
34: Gate electrode
10a, 11a, 12a: Lamination surface
40: Insulating part
50: Upper electrode

What is claimed is:

1. A magnetoresistance effect device comprising:
    an interlayer insulating layer;
    a through electrode that passes through the interlayer insulating layer and is exposed on at least one surface of the interlayer insulating layer; and
    a magnetoresistance effect element laminated on the through electrode,
    wherein a Vickers hardness difference between the interlayer insulating layer and the through electrode on a lamination surface on which the magnetoresistance effect element is laminated is 3 GPa or less, and
    a height of the through electrode above the interlayer insulating layer from the lamination surface is 1.5 nm or less.

2. The magnetoresistance effect device according to claim 1, wherein a convex degree obtained by dividing the height by a maximum width of the through electrode above the lamination surface is 0.015 or less.

3. The magnetoresistance effect device according to claim 1, wherein a material constituting the lamination surface of the through electrode is a nitride containing any one selected from a group consisting of Ti, Nb, V, Ta, Zr, and Al.

4. The magnetoresistance effect device according to claim 2, wherein a material constituting the lamination surface of the through electrode is a nitride containing any one selected from a group consisting of Ti, Nb, V, Ta, Zr, and Al.

5. The magnetoresistance effect device according to claim 1, wherein the interlayer insulating layer is either silicon oxide or zirconium oxide.

6. The magnetoresistance effect device according to claim 1, wherein, the interlayer insulating layer is silicon oxide, and
    a material constituting the lamination surface of the through electrode is vanadium nitride.

7. The magnetoresistance effect device according to claim 2, wherein, the interlayer insulating layer is silicon oxide, and
    a material constituting the lamination surface of the through electrode is vanadium nitride.

8. The magnetoresistance effect device according to claim 1, wherein, the interlayer insulating layer is zirconium oxide, and
    a material constituting the lamination surface of the through electrode is a nitride containing any one selected from a group consisting of Nb, V, and Al.

9. The magnetoresistance effect device according to claim 2, wherein, the interlayer insulating layer is zirconium oxide, and
    a material constituting the lamination surface of the through electrode is a nitride containing any one selected from a group consisting of Nb, V, and Al.

10. The magnetoresistance effect device according to claim 1, wherein, the interlayer insulating layer is silicon oxide, and
    a material constituting the lamination surface of the through electrode is a nitride containing any one selected from a group consisting of Nb, Zr, and Al.

11. The magnetoresistance effect device according to claim 2, wherein, the interlayer insulating layer is silicon oxide, and
    a material constituting the lamination surface of the through electrode is a nitride containing any one selected from a group consisting of Nb, Zr, and Al.

12. The magnetoresistance effect device according to claim 1, wherein, the interlayer insulating layer is any one of chromium nitride, silicon carbonitride, and aluminum oxide, and
    a material constituting the lamination surface of the through electrode is a nitride containing Ti or Zr.

13. The magnetoresistance effect device according to claim 1, further comprising an insulating part that covers a lateral surface of the magnetoresistance effect element,
    wherein the insulating part is made of a nitride.

14. The magnetoresistance effect device according to claim 1, wherein, the magnetoresistance effect element is a tunnel magnetoresistance effect element, and
    a degree of lattice mismatching between a lattice constant of a tunnel barrier layer of the tunnel magnetoresistance effect element and a lattice constant of a crystal structure to be taken by the through electrode is 5% or less.

15. The magnetoresistance effect device according to claim 1, wherein an electrical resistivity of the through electrode is 200 μΩ·cm or less.

16. The magnetoresistance effect device according to claim 14, wherein the degree of lattice mismatching is defined by formula (1), $$\text{degree of lattice mismatching} = |A - nB|/nB \qquad (1),\text{ and}$$

in the formula (1), A is the lattice constant of the tunnel barrier layer, B is the lattice constant of the crystal structure to be taken by the through electrode, and n is a positive integer or 1/a positive integer.

17. The magnetoresistance effect device according to claim 14, wherein materials of the tunnel barrier layer is one or more selected from a group consisting of $Al_2O_3$, $SiO_2$, MgO, and $MgAl_2O_4$.

* * * * *